United States Patent
Altun et al.

(10) Patent No.: US 11,307,252 B2
(45) Date of Patent: Apr. 19, 2022

(54) PERFECT DETECTION OF CONCURRENT FAULTS IN CMOS CIRCUITS BY EXPLOITING REVERSIBLE AND PRESERVATIVE GATES

(71) Applicant: Istanbul Teknik Universitesi, Istanbul (TR)

(72) Inventors: Mustafa Altun, Istanbul (TR); Sajjad Parvin, Istanbul (TR)

(73) Assignee: Istanbul Teknik Universitesi, Istanbul (TR)

( * ) Notice: Subject to any disclaimer, the term of this patent is extended or adjusted under 35 U.S.C. 154(b) by 0 days.

(21) Appl. No.: 17/092,352

(22) Filed: Nov. 9, 2020

(65) Prior Publication Data

US 2021/0141015 A1    May 13, 2021

(30) Foreign Application Priority Data

Nov. 7, 2019 (TR) .................................. 2019/17294

(51) Int. Cl.
*G01R 31/319* (2006.01)
*H03K 19/003* (2006.01)

(52) U.S. Cl.
CPC ..... *G01R 31/319* (2013.01); *H03K 19/00315* (2013.01)

(58) Field of Classification Search
None
See application file for complete search history.

(56) References Cited

FOREIGN PATENT DOCUMENTS

| EP | 0249119 A1 | 12/1987 |
| GB | 1497745 A | 1/1978 |
| JP | S6029680 A | 2/1985 |
| JP | H11145800 A | 5/1999 |
| KR | 20010092804 A | 10/2001 |

OTHER PUBLICATIONS

Mustafa Altun et al., Exploiting Reversible Computing for Latent-Fault-Free Error Detecting/Correcting CMOS Circuits, IEEE Access, 2018, pp. 74475-74484, vol. 6.
Behrooz Parhami, Fault-Tolerant Reversible Circuits, Fortieth Asilomar Conference on Signals, Systems and Computers, 2006, pp. 1726-1729.
K. Fazel et al., ESOP-based Toffoli Gate Cascade Generation, IEEE Pacific Rim Conference on Communications, 2007, pp. 206-209.
Sajjad Parvin et al., Implementation of CMOS Logic Circuits with Perfect Fault Detection Using Preservative Reversible Gates, IEEE 25th International Symposium on On-Line Testing and Robust System Design (IOLTS), Rhodes, 2019, pp. 64-67.

*Primary Examiner* — Guerrier Merant
(74) *Attorney, Agent, or Firm* — Bayramoglu Law Offices LLC

(57) ABSTRACT

A method of perfect detection of concurrent faults in CMOS circuits, using reversible gates and preservative gates is provided. The concurrent faults occurring in the CMOS circuits are detected without being masked by the method. The method includes the following steps: Carrying out functions using the reversible gates and the preservative gates, transforming the reversible gates and the preservative gates into CMOS circuit equivalents.

3 Claims, 4 Drawing Sheets

PERFECT DETECTION OF CONCURRENT FAULTS IN CMOS CIRCUITS BY EXPLOITING REVERSIBLE AND PRESERVATIVE GATES

CROSS REFERENCE TO THE RELATED APPLICATIONS

This application is based upon and claims priority to Turkish Patent Application No. 2019/17294, filed on Nov. 7, 2019, the entire contents of which are incorporated herein by reference.

TECHNICAL FIELD

The invention is related to a method of perfect detection of concurrent (online) faults, in CMOS circuits, using reversible and preservative gates. The faults occurring in CMOS circuits can be detected without being masked, by means of the said method.

BACKGROUND

CMOS, abbreviated from the first letters of the words "Complementary Metal Oxide Semiconductor", can be defined as a technology for the production of an integrated circuit. Nowadays, we come across CMOS elements mostly in integrated circuits. However CMOS technology is not limited to this and it is used in microprocessors, microcontrollers, static-RAM and several other digital logic circuits. Moreover this technology allows the NMOS and PMOS transistors called N-type and P-type to be realized on the same circuit.

Concurrent fault detection is very important for critical reliable applications where data integrity is crucial. In the case of a breakdown, the malfunction should be detected rapidly and in real time and the suitable process to the system should be applied in order to solve this problem. To reach this aim, in order to detect faults in a circuit, procedures such as "Dual Modular Redundancy (DMR)", "Triple Modular Redundancy (TMR)" or "Modular Redundancy" are applied.

However, these techniques cannot detect faults 100%. The reason for this is that the traditional CMOS logic gates, mask some faults at their output, due to mainly to their irreversibility feature and related "don't care" conditions.

In the art, circuits have been developed that are used to detect faults in CMOS circuits without masking them.

In the Korean patent document numbered KR20010092804 of the prior art, an fault detection device in a CMOS logic circuit for increasing the reliability of a system, by detecting correctly, an fault arising from extreme current is disclosed.

In the European Patent document numbered EP0249119 of the prior art, simplified equivalent or non equivalent gate circuits for the usage of active test helpers in correcting CMOS circuit elements is disclosed.

In the Great Britain patent document numbered GB1497745 of the prior art, a non stationary electronic circuit arrangement to be used in logic processing systems in order to remember the logical status of transitionary signals is disclosed.

In the Japanese patent document numbered JPS6029680 of the prior art, a test method for a CMOS logic circuit used in a gate series is disclosed.

In the American patent document numbered JPH11145800 of the prior art, a method for controlling the latency time of a CMOS variable latency circuit and a semi-conductive test apparatus is disclosed.

When the present circuit arrangements of the art are examined, it has been realized that there is a requirement for a novel fault detection method to detect faults 100% such that each and every switching fault in gate inputs and outputs should be transferred to the output of the circuit/system consisting of gates, so there is no "latent fault". Latent faults are defined as faults that might exist in a circuitry, but the circuit still produces the correct results at the output.

SUMMARY

The aim of the invention is to realize a method where reversible and preservative gates are used that can detect concurrent faults 100% in CMOS circuits.

Another aim of the invention is to realize a method where a novel reversible gate is used to eliminate latent faults that allows the faults to be observed at the output without masking them.

BRIEF DESCRIPTION OF THE DRAWINGS

The fault detection method, developed in order to reach the aims of the invention has been shown in the attached figures.

DETAILED DESCRIPTION OF THE EMBODIMENTS

The method of the invention, basically comprises the steps of;
1) carrying out functions using preservative and reversible gates,
2) transforming the gates into CMOS circuit equivalents.

The gate formations in step 1), comprises the following steps;
1-1) providing a given logic function without taking into account if the function is reversible or not,
1-2) the given function is checked if it is reversible or irreversible, and it is determined as a reversible function,
1-3) the given function is checked if it is reversible or irreversible, and it is determined as an irreversible function,
1-4) converting the irreversible function to a reversible function,
1-5) utilizing ET-MPMCT gates for ESOP synthesis technique which is capable of synthesizing both reversible and irreversible functions or the use of Fredkin synthesis technique to implement a function with a fault preservative circuit,
1-6) synthesizing a reversible function using conventional reversible circuit synthesis techniques with conventional reversible gate libraries, 1-7) adding an extra parity bit to perform single parity fault detection with converting all gates to their preservative versions, There are 2 required and sufficient conditions for a given logic function to be reversible.

These are as follows;
1. the number of inputs and outputs must be equal;
2. each input assignment in terms of 0's and 1's should have its distinct output assignment. Similarly, each input assignment in terms of 0's and 1's should have its distinct output assignment. Therefore there should be a one-to-one matching between input and output assignments.

If a function is not reversible, it can be made reversible by adding new inputs/outputs such that they provide the above mentioned 2 conditions.

Figure 3:
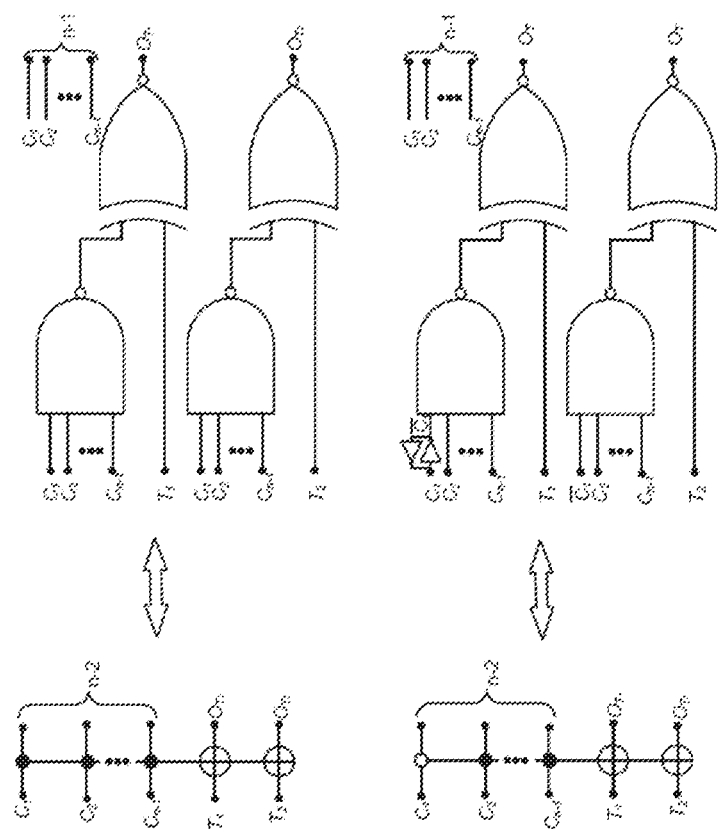
FIG. 3: View of the transformation of the reversible ET-MPCMT gate into a multi layered CMOS circuit, according to the method of the invention.
Figure 4:
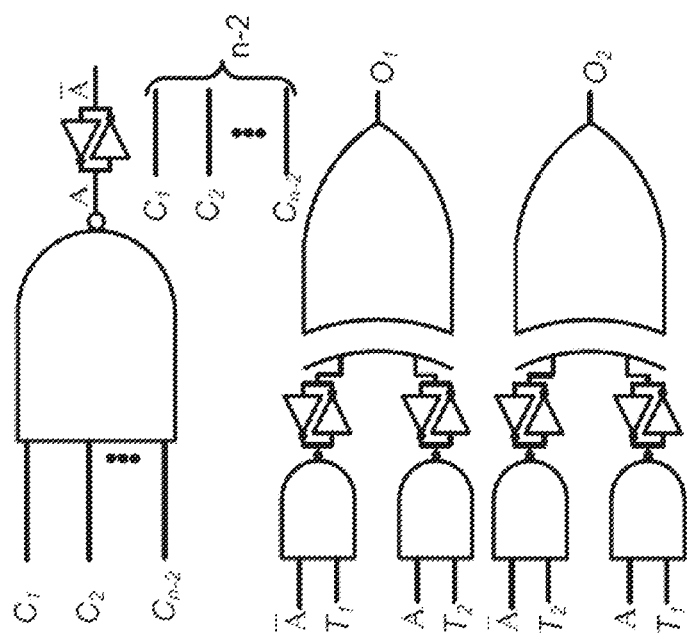
FIG. 4: Schematic view of the transformation of the reversible Fredkin gate into a multi layered CMOS circuit, according to the method of the invention.
Figure 4:
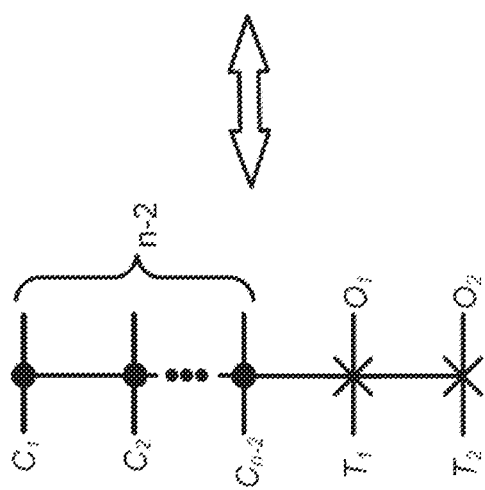

The order of the CMOS transformations of ET-MPCMT and Fredkin gates has been provided in FIG. 3 and FIG. 4. The transformation is carried out such that the outputs that are basically referred to as "O", are turned into the outputs of the XOR gates and the inputs referred to as "C" are turned into inputs of the NAND and NOT gates. The mentioned gates are the primary construction blocks of a digital library of a CMOS process.

Figure 1:
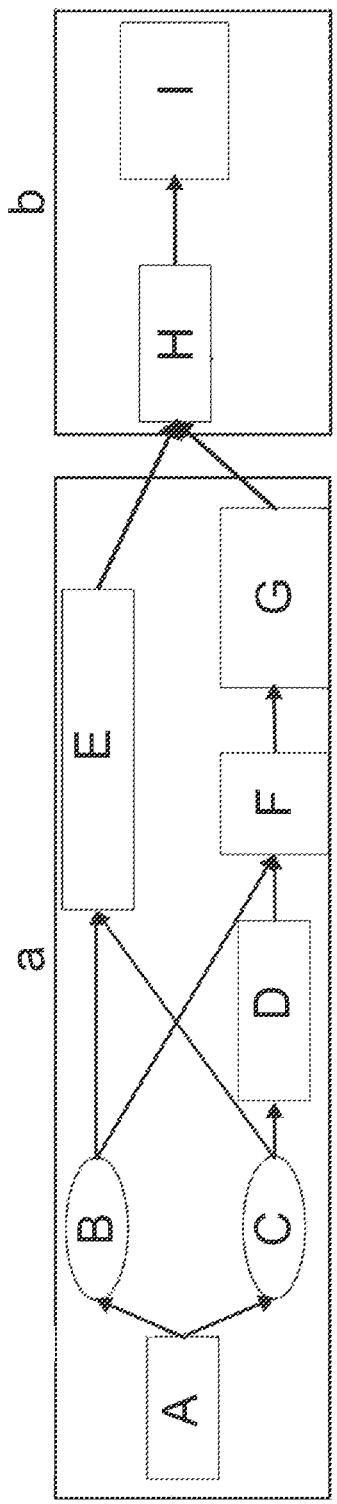
FIG. 1: View of the general flow diagram of the method subject to the invention.

The general flow diagram of the method has been given in FIG. 1. As a result a single fault (switching from logic 1 to 0 or from logic 0 to 1) that shall occur in CMOS circuit nodes (gate input and output nodes) can always be detected.

Three different methods have been provided in order to carry out functions where reversible gates are used in step 1). These are respectively, 1—synthesis with Fredkin gates [1,2], corresponding to step 1-5); 2—synthesis of the circuit that has been synthesized with MPMCT (Mixed Polarity Multiple Control Toffoli) gates by transforming it into an ET-MPMCT (Even Target-Mixed Polarity Multiple Control Toffoli) gate circuit [3], corresponding to step 1-7); 3—carrying out ESOP (Exclusive Sum of Products) based synthesis by directly using ET-MPMCT gates [4], corresponding to step 1-5).

Figure 2:
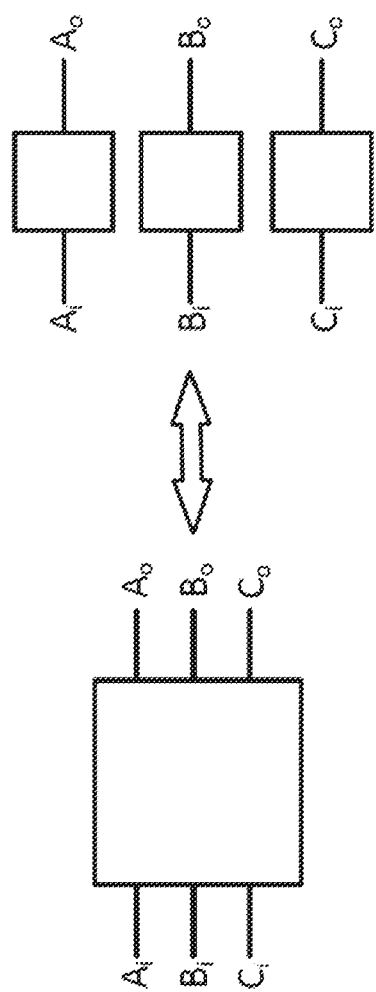
FIG. 2: Schematic view of the transformation of a multilayer reversible gate into a single layer CMOS circuit by the method of the invention.

Transforming a reversible gate into a CMOS realization can be carried out in a single layer design or a multi layer design. In single layer circuits, at most one gate is available in the circuit routes that travel from the inputs towards the outputs. If a single gate, already provided in digital libraries of a certain CMOS process or to be added, can be used for each input-output line of the reversible gate, the fault masking probability is eliminated and faults can be detected 100%. This single layer design that is obtained is given in FIG. 2. If two or more gates are used to reach any of the outputs starting from any of the inputs, the circuit is not a single layer circuit. In this case, a multilayer CMOS design can be used in order to detect faults 100%. The multilayer designs of the ET-MPCMT and Fredkin gate libraries have been shown in FIG. 3 and FIG. 4 respectively.

This step, referred to as step 2), comprises the following steps;
2-1) converting reversible gates to their CMOS equivalent forms,
2-2) obtaining the CMOS circuit having 100% fault detection capability.

It should be taken into account that as the circuit obtained as a result is formed of CMOS gates; it is no longer reversible.

REFERENCES

[1] M. Altun, S. Parvin and M. H. Cilasun, "Exploiting Reversible Computing for Latent-Fault-Free Fault Detecting/Correcting CMOS Circuits," in IEEE Access, vol. 6, pp. 74475-74484, 2018.
[2] B. Parhami, "Fault-Tolerant Reversible Circuits," 2006 Fortieth Asilomar Conference on Signals, Systems and Computers, Pacific Grove, C A, 2006, pp. 1726-1729.
[3] K. Fazel, M. A. Thornton and J. E. Rice, "ESOP-based Toffoli Gate Cascade Generation," 2007 IEEE Pacific Rim Conference on Communications, Computers and Signal Processing, Victoria, B C, 2007, pp. 206-209.
[4] S. Parvin and M. Altun, "Implementation of CMOS Logic Circuits with Perfect Fault Detection Using Preservative Reversible Gates," 2019 IEEE 25th International Symposium on On-Line Testing and Robust System Design (IOLTS), Rhodes, Greece, 2019, pp. 64-67.

What is claimed is:

1. A method of perfect detection of concurrent faults in CMOS circuits, using reversible gates and preservative gates, comprising the following steps:
  1) carrying out functions using the reversible gates and the preservative gates, by:
    1-1) providing a given logic function,
    1-2) when the given logic function is an irreversible function, converting the irreversible function to a reversible function,
    1-3) utilizing ET-MPMCT gates for an ESOP synthesis technique, wherein the ESOP technique synthesizes both the reversible function and the irreversible function or a use of a Fredkin synthesis technique to implement a function with a fault preservative circuit,
    1-4) synthesizing the reversible function using reversible circuit synthesis techniques with reversible gate libraries,
    1-5) adding an extra parity bit to perform single parity fault detection with converting all gates to preservative versions of all the gates,
  2) transforming the reversible gates and the preservative gates into CMOS circuit equivalents by:
    2-1) converting the reversible gates to CMOS forms of the reversible gates.

2. The method according to claim 1, wherein step 1) comprises the following steps after step 1-1:
  1-1a) providing a given logic function without taking into account if the given logic function is reversible or not,
  1-1) the given logic function is checked when the given logic function is reversible or irreversible, and the given logic function is determined as a reversible function,
  1-1 c) the given logic function is checked when the given logic function is reversible or irreversible, and the given logic function is determined as an irreversible function.

3. The method according to claim 1, wherein step 2) comprises the following additional steps:
  2-2) obtaining a CMOS circuit of the CMOS circuits having a perfect fault detection capability.

* * * * *